United States Patent
Daniele et al.

(10) Patent No.: US 11,136,499 B2
(45) Date of Patent: Oct. 5, 2021

(54) AQUEOUS COMPOSITION CONTAINING SUSPENDED ZNO PARTICLES

(71) Applicants: UNIVERSITE CLAUDE BERNARD LYON 1, Villeurbanne (FR); CENTRE NATIONAL DE LA RECHERCHE SCIENTIFIQUE, Paris (FR)

(72) Inventors: Stéphane Daniele, Meyzieu (FR); Audrey Valette, Meyzieu (FR); Thibaut Cornier, Villeurbanne (FR)

(73) Assignees: UNIVERSITE CLAUDE BERNARD LYON 1, Villeurbanne (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 571 days.

(21) Appl. No.: 15/504,371

(22) PCT Filed: Sep. 11, 2015

(86) PCT No.: PCT/FR2015/052434
§ 371 (c)(1),
(2) Date: Feb. 16, 2017

(87) PCT Pub. No.: WO2016/038317
PCT Pub. Date: Mar. 17, 2016

(65) Prior Publication Data
US 2017/0233646 A1    Aug. 17, 2017

(30) Foreign Application Priority Data

Sep. 12, 2014 (FR) ...................................... 1458575

(51) Int. Cl.
| | |
|---|---|
| C09K 11/02 | (2006.01) |
| C09K 11/54 | (2006.01) |
| C08L 33/02 | (2006.01) |
| H01L 31/055 | (2014.01) |
| C09C 1/04 | (2006.01) |
| C09C 3/10 | (2006.01) |
| C09K 15/06 | (2006.01) |

(52) U.S. Cl.
CPC ............. *C09K 11/54* (2013.01); *C08L 33/02* (2013.01); *C09C 1/043* (2013.01); *C09C 3/10* (2013.01); *C09K 11/02* (2013.01); *C09K 15/06* (2013.01); *H01L 31/055* (2013.01); *C08L 2201/54* (2013.01); *C08L 2203/204* (2013.01); *C08L 2205/025* (2013.01); *Y02E 10/52* (2013.01)

(58) Field of Classification Search
CPC ........ C09K 11/02; C09K 11/54; C09K 15/06; C08L 2201/54; C08L 2203/204; C08L 2205/025; C08L 33/02; Y10T 428/2991; Y10T 428/2998; H01L 31/055
USPC ...................................... 252/301.36; 428/407
See application file for complete search history.

(56) References Cited

U.S. PATENT DOCUMENTS

| | | | | |
|---|---|---|---|---|
| 2010/0119829 | A1* | 5/2010 | Karpov | ..................... C09C 3/10 428/407 |
| 2011/0130273 | A1* | 6/2011 | Karpov | ..................... C01G 9/02 502/343 |
| 2014/0048738 | A1* | 2/2014 | Xia | ......................... H01F 1/01 252/62.54 |

FOREIGN PATENT DOCUMENTS

| | | |
|---|---|---|
| EP | 2497456 A1 | 9/2012 |
| WO | 2010/068687 A1 | 6/2010 |

OTHER PUBLICATIONS

International Search Report (and English Translation thereof) and Written Opinion issued in PCT/FR2015/052434, dated Oct. 16, 2015.

Taubert, A., et al., "Kinetics and Particle Formation Mechanism of Zinc Oxide Particles in Polymer-Controlled Precipitation from Aqueous Solution", Langmuir, vol. 18, No. 11, pp. 4488-4494 (2002).

\* cited by examiner

*Primary Examiner* — Matthew E. Hoban
*Assistant Examiner* — Lynne Edmondson
(74) *Attorney, Agent, or Firm* — Greer, Burns & Crain, Ltd.

(57) ABSTRACT

The invention relates to an aqueous composition comprising a suspension of ZnO particles and a polymer stabiliser containing carboxylic acid functions and carboxylic acid salt functions.

5 Claims, 1 Drawing Sheet

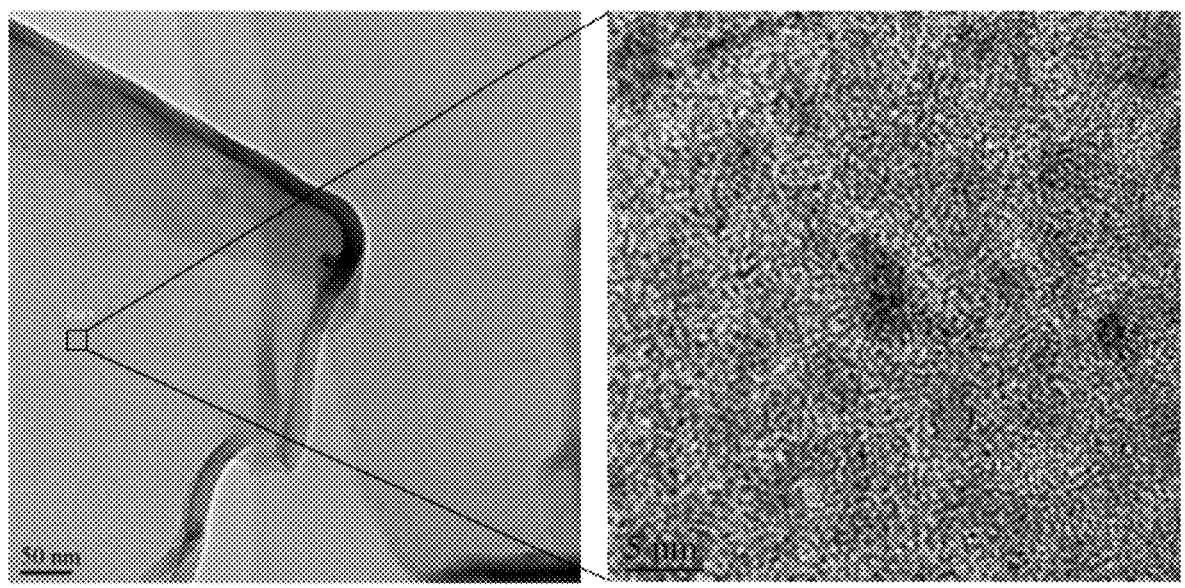

AQUEOUS COMPOSITION CONTAINING SUSPENDED ZNO PARTICLES

CROSS REFERENCE TO RELATED APPLICATIONS

This application is a national stage filing under section 371 of International Application No. PCT/FR2015/052434, filed on Sep. 11, 2015, and published on Mar. 17, 2016 as WO 2016/038317, which claims priority to French Application No. 1458575, filed on Sep. 12, 2014. The entire contents of each of said applications are hereby incorporated herein by reference.

BACKGROUND

The present invention relates to an aqueous composition containing ZnO particles suspended in the presence of a stabilizer having carboxylic acid and carboxylic acid salt functions.

The field of application for the present invention relates in particular to photovoltaic cells.

Since solar energy is a renewable energy source available freely in all regions of the world, converting it into electrical energy will be a major issue for decades to come.

Generally, the devices allowing this type of conversion are in particular silicon-based photovoltaic cells, thin film devices, heterojunction cells, or hybrid inorganic/organic cells.

Among these various technologies, silicon-based devices remain predominant. These however do still need improving given that their energy yield (solar/electric conversion) does not generally exceed 25%, whereas the theoretical limit is of the order of 33.5%.

This yield loss (<25% vs. 33.5%) is because crystalline silicone is only able to absorb photons in the visible and near infrared domains, generally between 300 and 1100 nm, with a maximum at 600 nm. Electromagnetic radiation coming from the sun is therefore only partially absorbed by the silicon.

Consequently, one of the problems related to improving the yield of silicone-based cells consists in absorbing at least one portion of the ultra-violet or infrared radiation. In fact, the problem is to absorb photons in the ultraviolet or infrared domains, and then to emit the photons in the visible domain in which silicon absorbs. This technology therefore consists in changing the photons' energy.

To achieve this, the silicon can be covered by a layer of transparent material that can absorb in the ultra-violet or infrared and reemit in the visible.

In this respect, it has been shown that zinc oxide, ZnO, allows photons to be absorbed in the ultraviolet domain and reemitted in the visible. However, these properties are not obtained for all sorts of ZnO particles; the properties depend in particular on the surface state of the particles, and the organic stabilizers/ligands used.

Additionally, using this type of material requires having packaging that is stable over time and under the conditions of use. This material must also be transparent, and easy to use.

The present invention relates to a stable composition of ZnO particles suspended in an aqueous medium that solves the technical problem relating to the improvement of the yield of silicon-based photovoltaic cells, while remaining stable over time.

SUMMARY

The present invention relates to an aqueous composition of ZnO particles suspended presenting increased stability related to compositions from the prior art, but also a luminescence yield making it particularly suitable for use in the photovoltaic domain.

The Applicant has discovered that using a specific stabilizer allowed preparation of a stable aqueous suspension of ZnO particles.

More specifically, the present invention relates to an aqueous composition comprising a suspension of ZnO particles and a polymer stabilizer containing carboxylic acid functions and carboxylic acid salt functions.

The polymer stabilizer maintains the suspended ZnO particles and provides the necessary stability over time. These properties result from the combined presence of carboxylic acid and carboxylic acid salt functions.

The polymer stabilizer is advantageously water soluble. In other words, it is advantageously soluble in water under the conditions of use.

By contrast with the compositions of the prior art, this suspension may be dehydrated to form a composition in powder form. The composition in powder form can then be redispersed in water and also have the initial stability properties.

The polymer stabilizer may in particular be based on the following monomers: acrylic acid and/or methacrylic acid; acrylic acid salt and/or methacrylic acid salt. It may in particular be one of the following combinations:
  acrylic acid; acrylic acid salt;
  methacrylic acid; acrylic acid salt;
  acrylic acid; methacrylic acid salt;
  methacrylic acid; methacrylic acid salt.

It may also be a mixture of acrylic acid and methacrylic acid and their respective salts.

According to one specific embodiment, the polymer stabilizer may in particular be a (meth)acrylic acid and (meth)acrylic acid salt copolymer.

The expression (meth)acrylic acid denotes acrylic acid or methacrylic acid or the mixture of acrylic acid+methacrylic acid.

The expression (meth)acrylic acid salt denotes acrylic acid salt or methacrylic acid salt or the mixture of acrylic acid salt+methacrylic acid salt.

In this case, it may be a block copolymer obtained by copolymerization of monomers having a carboxylic acid function and monomers having a carboxylic acid salt function. It may therefore be presented in the form of a block copolymer comprising at least one block having carboxylic acid functions and at least one block having carboxylic acid salt functions. It may also result from the partial neutralization of carboxylic acid functions of a polymer such as for example poly(acrylic acid) or poly(methacrylic acid).

According to one specific embodiment, the polymer stabilizer may be a mixture of a (meth)acrylic acid polymer and a (meth)acrylic acid salt polymer.

Carboxylic acid salt and acrylic acid salt are understood respectively to mean the carboxylate function $—C(=O)O^- A^+$ and the acrylate function $CH_2=CH—C(=O)O^- A^+$, in which the counterion $A^+$ is advantageously an alkali metal or ammonium cation (quaternary, tertiary, secondary or primary ammonium). The counterion is advantageously chosen from the group comprising $K^+$, $Na^+$, $Li^+$, and quaternary ammoniums such as $NR_4$ with R=alkyl containing 1 to 18 carbon atoms.

Advantageously, the stabilizer is a mixture of a (meth)acrylic homopolymer and a (meth)acrylic acid salt homopolymer. It may in particular be a mixture of poly(acrylic acid) and poly(sodium acrylate).

The molar ratio of carboxylic acid functions to carboxylic acid salt functions is advantageously included between 25/75 and 75/25, more advantageously between 35/65 and 65/35, and even more advantageously between 45/55 and 55/45, advantageously of the order of 50/50. This range of values allows optimization of the photoluminescence properties of the composition according to the invention. The molar ratio of carboxylic acid functions to carboxylic acid salt functions corresponds to the ratio between the number of COOH and COO$^-$ groups.

According to another embodiment, the mass ratio of carboxylic acid functions to carboxylic acid salt functions is advantageously included between 25/75 and 75/25, more advantageously between 35/65 and 65/35, and even more advantageously between 45/55 and 55/45, advantageously of the order of 50/50. This embodiment is particularly suited to polymer mixtures, for example a mixture of a (meth) acrylic acid polymer and a (meth)acrylic acid salt polymer.

In an advantageous manner, the polymer or polymers constituting the polymer stabilizer has, if need be independently of each other, a molecular weight included between 500 and 240,000 g/mol, more advantageously between 1000 and 100,000 g/mol, and even more advantageously between 1500 and 5000 g/mol.

Using polymer(s) with a molecular weight less than or equal to 240,000 g/mol allows optimization of the quantum yield of the composition according to the invention.

"Molecular weight" is understood to mean the average molecular weight of the polymer. The general understanding of the person skilled in the art will allow him to measure it according to conventional techniques.

The polymer or polymers constituting the polymer stabilizer may also comprise at least one additional co-monomer not comprising carboxylic acid or carboxylate functions. It may in particular be nonionic, cationic and/or anionic monomers. As an example, this type of co-monomer may in particular be (meth)acrylamide or a (meth)acrylamide derivative.

Typically, the stabilizer may represent 0.01 to 10% by weight relative to the weight of the aqueous composition of ZnO particles, more advantageously between 0.1 and 3%, more advantageously between 0.5 and 1%, and even more advantageously between 0.5 and 0.7%. This percentage represents the total mass percentage (concentration) of stabilizer, in particular when it is constituted of a mixture of polymers.

According to one advantageous embodiment, the aqueous composition of ZnO particles comprises between 0.5 and 1% by weight, advantageously between 0.5 and 0.7%, of stabilizer which is constituted of a mixture of:
  poly((meth)acrylic acid) having a molecular weight less than or equal to 240,000 g/mol, advantageously included between 2000 and 100,000 g/mol, more advantageously poly(acrylic acid); and
  poly(sodium (meth)acrylate) having a molecular weight less than or equal to 240,000 g/mol, advantageously included between 4000 and 100,000 g/mol, more advantageously poly(sodium acrylate).

In addition, the ZnO particles advantageously represent 0.01 to 20% by weight of the weight of the aqueous composition, more advantageously between 0.05 and 10%, and even more advantageously between 0.1 and 2%.

Generally, the ZnO particles have an average diameter that can be less than 100 nanometers, more advantageously less than 20 nanometers, even more advantageously included between 2 and 15 nanometers. Accordingly, the problems of low transparency encountered with larger particles are prevented.

They advantageously have the form of a core/shell, the core being made of ZnO and the shell of polymer stabilizer.

Also, the ZnO particles are advantageously crystalline.

The ZnO particle/polymer stabilizer mass ratio is advantageously included between 40 and 80%, more advantageously between 50 and 60%.

The present invention also relates to the dehydrated composition obtained by removing the water from the aqueous composition described above.

The water can in particular be removed by lyophilization or by evaporation. As an example, it can be done using a rotary evaporator, at a temperature of 60° C. and a pressure of 7 MPa (70 bar).

The water can be removed completely or partially. The purpose can be to increase the concentration of ZnO particles in the composition. In this respect, we underscore that the concentration ranges stated above relate to the composition after its preparation, and before any water removal.

Indeed, the Applicant has noted that in a completely unexpected manner, the aqueous composition may be dried by any technique that is part of the general knowledge of the person skilled in the art, then reformed by the addition of water. The ZnO particles are then suspended stably once again. By contrast, adding the stabilizer having carboxylic acid and carboxylic acid salt functions to a solid or aqueous composition of ZnO particles from the prior art does not produce this effect. The resulting suspension is then unstable.

Accordingly, the composition according to the invention may be concentrated. The ZnO particle concentration and the viscosity of the composition may therefore be adjusted to improve the use as a function of potential applications. A viscous composition may allow a thicker deposit than a dilute composition. This is particularly important for the field of application of photovoltaics, which may involve depositing the composition on a glass substrate, for example.

The present invention additionally relates to the preparation method for the aqueous composition comprising a suspension of ZnO particles. This method comprises the following steps:
  preparation of an aqueous solution comprising a stabilizer containing carboxylic acid functions and carboxylic acid salt functions;
  addition of a zinc precursor;
  formation of ZnO particles by hydrolysis of the zinc precursor;
  production of an aqueous composition comprising a suspension of ZnO particles and a polymer stabilizer.

In this method, the zinc precursor is added after the stabilizer.

In addition, this method is advantageously used at ambient pressure and temperature.

The zinc precursor used is hydrolyzable. It may in particular be chosen from the group comprising $ZnR_2$; $Zn(OR)_2$; $Zn(NR_2)_2$; $Zn(O-C(=O)R)_2$; R being a hydrocarbon group comprising 1 to 18 carbon atoms, advantageously an alkyl group comprising 1 to 4 carbon atoms.

According to one preferred embodiment, the zinc precursor is $Zn(Et)_2$.

Although the present invention relates to an aqueous composition, this does not exclude that it may also comprise traces of organic solvent. This is in particular the case when the zinc precursor is sold in an organic solvent, toluene for example.

In this case, it is possible to remove any trace of solvent (and optionally water), so as to produce a powder of ZnO particles and stabilizer. As already indicated, these ZnO particles may then be redispersed in water to produce a particle suspension again. The resulting composition is then devoid of any trace of organic solvent.

The present invention also relates to using the aqueous composition of suspended ZnO particles, in the field of photovoltaic cells, paint, cosmetics, textiles, electronics (e.g. diodes, transducers, lasers), biosensors, and anti-microbial and anti-fouling coatings.

With the presence of the stabilizer, a homogeneous suspension can be obtained and the ZnO particles deposited homogeneously on a substrate, thereby improving the properties of the substrate (e.g. fungicide, bactericide, UV-visible conversion).

The aqueous composition according to the invention has many advantages that make it particularly suited to use in the photovoltaic field:
  possibility of concentrating the composition in particular to adjust the viscosity thereof and thereby facilitate use thereof and also transport thereof;
  transparency in the absorption range of crystalline silicon (300 and 1100 nm);
  capacity to absorb photons in the ultraviolet range and to reemit photons in the visible and near infrared (generally between 300 and 1100 nm), which improves the energy yield of a silicon-based photovoltaic cell.

The invention and the benefits that flow from it will be clearer upon reading the following figures and examples, given to illustrate the invention and not to limit it in any way.

BRIEF DESCRIPTION OF THE DRAWINGS

FIG. 1 shows an image obtained by transmission electron microscopy of an aqueous ZnO suspension according to the invention of which the polymer stabilizer has a molar ratio of carboxylic acid functions/carboxylic acid salt functions of 50/50.

DETAILED DESCRIPTION

1/ Influence of the Carboxylic Acid/Carboxylate (COOH/COO—) Mass Ratio on the Formation of a Stable Suspension.

Eight compositions comprising ZnO particles have been prepared. These compositions all comprise 0.63% by weight of stabilizer and 0.65% by weight of ZnO particles.

The nature of the stabilizer used is specified in table 1, for both the compositions according to the invention (INV-1 to INV-6) or for counter-examples (CE-1 and CE-2).

TABLE 1

Nature of the stabilizer according to the compositions prepared (mass percentages).

| | Examples | | | | | | | |
|---|---|---|---|---|---|---|---|---|
| | CE-1 | INV-1 | INV-2 | INV-3 | INV-4 | INV-5 | INV-6 | CE-2 |
| PAAH | 0% | 25% | 35% | 50% | 65% | 70% | 75% | 100% |
| PAA-Na | 100% | 75% | 65% | 50% | 35% | 30% | 25% | 0% |

PAAH: poly(acrylic acid) (2000 g/mol)
PAA-Na: poly(sodium acrylate) (4000 g/mol)

The compositions were prepared according to the following procedure:
  stabilizer in 25 mL of water added;
  2.0 mmol of diethyl zinc (1.8 mL of commercial solution at 15% by mass in toluene) added by drops while stirring;
  hydrolysis of $ZnEt_2$ and formation of ethane according to the following reaction: $ZnEt_2 + H_2O \rightarrow ZnO + 2\ EtH$
  Stirring is maintained for 1 or 24 hours at ambient temperature, preferably 1 hour.

The resulting composition has the form of:
  a clear suspension (INV-2 to INV-5)
  a cloudy suspension (INV-1 and INV-6);
  a powder that cannot be dispersed in water but can be dispersed in a water+PAAH mixture (CE-1 and CE-2). In this case, the powders that can be redispersed in water+PAAH reemit in UV, which is not compatible with use in the photovoltaic field.

To characterize these compositions, they were lyophilized.

TABLE 2

Characterization of lyophilized compositions of ZnO particles.

| | Examples | | | | | | | |
|---|---|---|---|---|---|---|---|---|
| | CE-1 | INV-1 | INV-2 | INV-3 (FIG. 1) | INV-4 | INV-5 | INV-6 | CE-2 |
| Appearance | − | + | ++ | ++ | ++ | ++ | + | − |
| QY | 4% | 2% | 8% | 20-25% | 5% | 11% | 7% | 20-36% |
| λ (nm) | 620 | 540 | 540 | 530 | 420 | 380 | 400 | 550 |
| pH | 8.9 | 10.8 | 10.7 | 10.0 | 8.9 | 8.8 | 8.6 | 3.4 |

λ corresponds to the maximum emission wavelength.

Appearance of the Composition:
−: powder and supernatant solution, and powder that is not redispersable in water
+: cloudy suspension, and lyophilized powder that can be redispersed in water
++: clear suspension, stable for several months, and lyophilized powder that can be redispersed in water The result given in Table 2 show that the best results in terms of photoluminescence and QY are obtained when the stabilizer is 100% PAAH (CE-2). However, the aqueous composition CE-2 does not comprise a suspension of ZnO particles.

As regards the compositions according to the invention, composition INV-3 (50% PAAH and 50% PAA-Na) emits at 530 nm and has a luminescence yield between 20 and 25%, which gives it very attractive properties for use in the photovoltaics domain.

Without wanting to be restricted by any theory, the Applicant considers that the ZnO particles can attach to the carboxylic acid functions whereas the carboxylic acid salt functions allow the ZnO particles to disperse without attachment thereto.

The quantum yield QY corresponds to the number of photons emitted relative to the number of absorbed photons. It is expressed as a percentage.

2/ Influence of the Quantity of Polymer Stabilizer on the Formation of a Stable Suspension.

The following examples relate to compositions obtained by hydrolysis of $ZnEt_2$ in the presence of 3.15% to 0.126% by weight of polymer stabilizer constituted of 50% by weight of PAAH (2000 g/mol) and 50% by weight of PAA-Na (4000 g/mol). In these examples, the mass ratio of COOH to COO— functions remains stable; only the mass concentration of the PAAH+PAA-Na stabilizer changes.

TABLE 3

QY as function of the quantity of stabilizer.

|  | INV-7 | INV-8 | INV-9 | INV-10 | INV-11 |
|---|---|---|---|---|---|
| Quantity of PAAH + PAA-Na stabilizer | 0.126 | 0.315 | 0.63 | 1.26 | 3.15 |
| QY | 2 | 14 | 25 | 6 | 6 |
| Appearance | ++ | ++ | ++ | ++ | ++ |

Appearance of the composition:
++: clear suspension, stable for several months, and lyophilized powder that can be redispersed in water Examples INV-7 to INV-9 produce stable and clear suspensions with a maximum emission between 500 and 600 nm. For examples INV-10 and INV-11, the emission is shifted to between 350 and 450 nm.

In addition, the higher the stabilizer quantity, the more the compound is amorphous and the greater is the mass loss observed in TGA (thermogravimetric analysis). For these less crystalline compounds, the luminescence band is shifted toward high energies (blue-shift) between 350 and 450 nm.

3/ Influence of the Molecular Weight of the Polymer Stabilizer on the Formation of a Stable Suspension.

The following examples relate to compositions obtained by hydrolysis of $ZnEt_2$ in the presence of a polymer stabilizer with a molecular weight included between 2000 and 240,000 g/mol (Table 4).

These examples relate to a ZnO suspension containing 0.63% by mass of polymer stabilizer PAAH/PAA-Na (50:50 mixture by weight), where the PAAH molecular weight varies from 2000 to 240,000 g/mol, and the PAA-Na molecular weight varies from 2000 to 240,000 g/mol. In all these compositions, the COOH/COO-mass ratio remains at 50/50.

The PAA-Na used is previously obtained by polymerization of sodium acrylate or by neutralization of poly(acrylic acid) by the addition of sodium hydroxide.

All these examples have produced a clear and stable suspension for several months, whose lyophilized powder can be redispersed in water.

Generally, the longer the PAA-Na chain (higher molecular weight), compared to the PAAH chain, the faster the suspension is obtained.

Table 4 gives the quantum yields (QY) for different PAAH/PAA-Na mixtures (50/50 ratio by weight) as a function of their molecular weight.

These compositions emit in the wavelengths that correspond to the green-orange color, which is more advantageous for applications in photovoltaic cells than emission in the blue.

4/ Quantum Yield as a Function of the PAAH/PAA-Na Mixture.

The following examples relate to compositions obtained by hydrolysis of $ZnEt_2$ in the presence of 0.4 to 1% by weight of polymer stabilizer (PAAH+PAA-Na) constituted of 50% by weight of PAAH (2000 g/mol) and 50% by weight of PAA-Na (4000 g/mol). In this composition, the COOH/COO— molar ratio varies as a function of the initial percentages by mass (concentrations) of the PAAH and PAANa solutions.

TABLE 5

Quantum yield (QY, %) as a function of the PAAH/PAA-Na weight ratio.

| PAAH | PAA-Na | | | | | |
|---|---|---|---|---|---|---|
|  | 0.40% by mass | 0.45% by mass | 0.50% by mass | 0.63% by mass | 0.8% by mass | 1% by mass |
| 0.40% by mass | 10 ± 1 | 6 ± 1 |  |  |  |  |
| 0.45% by mass | 10 ± 1 | 10 ± 1 |  |  |  |  |
| 0.50% by mass |  |  | 8 ± 1 | 7 ± 1 |  |  |
| 0.63% by mass |  |  | 10 ± 1 | 25 ± 1 | 14 ± 1 | 17 ± 1 |
| 0.8% by mass |  |  |  | 15 ± 1 | 16 ± 1 | 28 ± 1 |
| 1% by mass |  |  |  | 25 ± 1 | 26 ± 1 | 11 ± 1 |

According to table 5, the best results for quantum yield (QY) are obtained when the composition comprises 0.63 to 1% by weight of PAAH and 0.63 to 1% by weight of PAA-Na.

In these examples, a composition containing 1% by mass of stabilizer (PAAH+PAA-Na) is obtained from a mixture of 50% by mass of a first solution of PAAH at 1% by mass and 50% by mass of a second solution of PAA-Na at 1% by mass.

The invention claimed is:

1. A method for preparing an electrostatically stable aqueous suspension of ZnO particles and a polymer stabilizer said method consisting of the following steps:
   a) preparing an aqueous solution of a polymer stabilizer in water, wherein the polymer stabilizer is a copolymer of (meth)acrylic acid and a (meth)acrylic acid salt or the polymer stabilizer is a mixture a (meth)acrylic acid polymer and a (meth)acrylic acid salt polymer; and wherein a molar ratio of carboxylic acid group to

TABLE 4

Quantum yields (QY) and maximum emission wavelengths (λ, nm) as a function of the molecular weights of the PAAH and PAA-Na polymers.

|  | QY | λ (nm) | QY | λ (nm) | QY | λ (nm) | QY | λ (nm) | QY | λ (nm) |
|---|---|---|---|---|---|---|---|---|---|---|
| PAAH | PAA-Na | | | | | | | | | |
|  | 2000 | | 4000 | | 5000 | | 100,000 | | 240,000 | |
| 2000 | 16% | 550 | 25% | 550 | 18% | 560 | 18% | 540 | 16% | 545 |
| 5000 | 16% | 536 | 23% | 545 | 16% | 550 | 7% | 539 | 7% | 527 |
| 100,000 | 17% | 536 | 6% | 438 | 7% | 512 | 5% | 406 | 6% | 521 |
| 240,000 | 34% | 550 | 6% | 452 | 2% | 497 | 9% | 484 | 9% | 525 | carboxylic acid salt group in the polymer stabilizer is in the range from 25/75 to 75/25;

b) adding a zinc precursor to the aqueous solution of step a), wherein the zinc precursor is $ZnR_2$; $Zn(OR)_2$; $Zn(NR_2)_2$ or $Zn(O-C(=O)R)_2$; R being a hydrocarbon group comprising 1 to 18 carbon atoms; and forming at ambient temperature ZnO particles by hydrolysis of the zinc precursor in the aqueous solution; and thereby producing the electrostatically stable aqueous suspension of ZnO particles and the polymer stabilizer.

2. A method for manufacturing an article selected from the group consisting of photovoltaic cells, paint, textiles, electronics, biosensors, and anti-microbial and anti-fouling coatings, wherein the method comprises: depositing the electrostatically stable aqueous suspension of claim 1 on the article.

3. The method according to claim 1, wherein the stabilizer represents 0.01 to 10% by weight relative to the weight of the aqueous composition.

4. The method according to claim 1, wherein the ZnO particles represent 0.1 to 20% by weight relative to the weight of the aqueous composition.

5. The method according to claim 1, wherein: the molar ratio of carboxylic acid groups to carboxylic acid salt groups is included between 25/75 and 75/25; the ZnO particles represent 0.1 to 20% by weight relative to the weight of the aqueous composition; and the polymer stabilizer represents 0.5 to 0.7% by weight relative to the aqueous composition, and said polymer stabilizer is constituted of a mixture of: poly((meth)acrylic acid) having a molecular weight less than or equal to 240,000 g/mol; and of poly(methacrylic acid sodium salt) having a molecular weight less than or equal to 240,000 g/mol.

* * * * *